United States Patent
Boguslavskiy et al.

(10) Patent No.: US 9,497,803 B2
(45) Date of Patent: Nov. 15, 2016

(54) SUPPORTING SYSTEM FOR A HEATING ELEMENT AND HEATING SYSTEM

(71) Applicants: PLANSEE SE, Reutte (AT); PLANSEE USA LLC, Franklin, MA (US)

(72) Inventors: Vadim Boguslavskiy, Princeton, NJ (US); Arno Plankensteiner, Absam (AT)

(73) Assignees: Plansee SE, Reutte/Tirol (AT); Plansee USA LLC, Franklin, MA (US)

( * ) Notice: Subject to any disclaimer, the term of this patent is extended or adjusted under 35 U.S.C. 154(b) by 211 days.

(21) Appl. No.: 14/170,771

(22) Filed: Feb. 3, 2014

(65) Prior Publication Data
US 2015/0223291 A1    Aug. 6, 2015

(51) Int. Cl.
*H05B 3/06* (2006.01)
*H05B 3/66* (2006.01)
*H01L 21/67* (2006.01)
*H01L 21/687* (2006.01)

(52) U.S. Cl.
CPC ........... *H05B 3/66* (2013.01); *H01L 21/67103* (2013.01); *H01L 21/68785* (2013.01)

(58) Field of Classification Search
CPC ..... H05B 3/66; H05B 3/08; H01L 21/68785; H01L 21/67103; C23C 16/46; C30B 25/105
See application file for complete search history.

(56) References Cited

U.S. PATENT DOCUMENTS

| | | | |
|---|---|---|---|
| 4,860,306 A | 8/1989 | Gibb | |
| 5,187,771 A | 2/1993 | Uchida | |
| 6,023,487 A | 2/2000 | Jones | |
| 6,582,780 B1 * | 6/2003 | Tolt | C23C 16/271 118/715 |
| 7,645,342 B2 * | 1/2010 | Emerson | C23C 16/46 118/725 |
| 2002/0180466 A1 | 12/2002 | Hiramatsu et al. | |
| 2014/0042147 A1 * | 2/2014 | Plankensteiner | H05B 1/00 219/528 |

FOREIGN PATENT DOCUMENTS

WO    2014023413 A1    2/2014

* cited by examiner

*Primary Examiner* — Shawntina Fuqua
(74) *Attorney, Agent, or Firm* — Laurence A. Greenberg; Werner H. Stemer; Ralph E. Locher (57) ABSTRACT

A support system for supporting a heating element is formed with a supporting member and a resilient system. The supporting member has a main extension direction extending substantially in a height direction and a proximal and distal end. The proximal end is adapted to support the heating element. The resilient system includes a spring element, which is coupled to a distal portion of the supporting member and provides resiliency of the supporting member in a resilient direction and substantially restricts movements of the supporting member in a rigid direction. Furthermore, the resilient system extends at least partially from the distal portion in the height direction towards the proximal end.

13 Claims, 5 Drawing Sheets

SUPPORTING SYSTEM FOR A HEATING ELEMENT AND HEATING SYSTEM

BACKGROUND OF THE INVENTION

Field of the Invention

The present invention is related to a supporting system for the support of a heating element as well as to a heating system comprising at least one heating element.

Furnaces or electric heaters comprising resistive heating elements are commonly known and used in different industries for various applications. Thereby heat is generated when an electric current is applied through the electric conductive heating elements, also known as heating filaments, and due to electric resistance electric energy is dissipated into heat. Typically the heating elements are placed in close proximity to the item or material to be heated. Heater systems for various applications such as reactors for MOCVD (metal organic chemical vapor deposition) techniques used e.g. in the processing of semiconductor materials, e.g. for the epitaxial growth of compound semiconductors, are required to be operated at considerable elevated temperatures, e.g. above 800° C. which poses challenges in the design and on the material of the heating element assembly. For applications which require especially high temperatures the heating elements are frequently made from ceramic materials (which is expensive and difficult to manufacture into the desired geometric shape) or comprise refractory metals such as tungsten, molybdenum, rhenium, tantalum, niobium, etc. or alloys thereof.

When designing a high-temperature heating system one of the main issues one has to cope with is the thermally induced cyclic expansion and contraction of the heating elements. For certain applications in particular for MOCVD reactors a precise positioning of the heating elements is important, which should also be maintained in a controlled way during operation cycles of the heating system. Usually different kinds of mechanical support structures such as terminals are used to make sure that the heating elements are positioned correctly and kept in a predefined position. When e.g. during a MOCVD process inside of the reactor the heating elements are heated up to 1000 to 2200° C. the heating elements expand considerably and when kept in a fixed place by the terminal, significant mechanical stress is generated inside the material of the heating element. Such mechanical stress might lead to uncontrolled plastic deformations or cause the heating element to deteriorate or even break, leading to a decreased lifetime of the heating element. Uncontrolled deformations are undesired since there is a severe risk of a contact between the heating element with other parts of the heating systems or with other heating elements or within the heating element itself and as a consequence a short circuit might occur. Furthermore, since deformations of the heating elements influence the local electric resistivity plastic deformations are especially unfavorable in demanding high temperature applications like epitaxial growth processes of compound semiconductors where a homogeneous or otherwise precisely controlled temperature profile is important. The situation with heating elements comprising refractory metals is most problematic because the strength creep resistance of these metals decreases with temperature and drops substantially above 1200 to 1400° C. Above these temperatures even small stresses might cause undesired plastic deformations which are retained when the heating element cools down.

To overcome problems with fixed terminals various systems with flexible elements have been devised which are designed to allow expansion of the heating element in some preferable directions. Some such known terminals comprise different kinds of springs, e.g. with an U-form shape which allow a movement of the connection position between the heating element and the terminal. While such springs with an U-form shape achieve to reduce thermally induced stress inside the heating elements to a certain extent, their properties do not fully convince in practice since the heating element can extend itself in two or more directions and there remains a risk of a short circuit due to electric contact of the heating elements with itself or other parts of the heating system.

U.S. Pat. No. 7,645,342 B2 proposes for the heating elements to include a plurality of extended pin openings through which pins are inserted to fix the heating elements in a plane. The size and geometric shape of the pin openings are designed such that within a certain temperature range they should allow the expansion of the heating element in the horizontal direction. However, in practical implementations several problems occur, especially at high temperatures above 1500° C. It is found that at such high temperatures the pins which are in contact with the heating element and usually are made of refractory metals have a tendency to bond via diffusion to the heating elements, thus hindering them from a free movement in a horizontal direction. As a consequence, mechanical stress is built up upon heating, leading to plastic deformations of the shape of the heating element.

In light of the foregoing, there is a need in the industry for supporting systems for heating elements, in particular for heating elements which can be used in high temperature heaters operating at temperatures above 1600° C.

SUMMARY OF THE INVENTION

It is accordingly an object of the invention to provide a support system for a heating element which overcome the above-mentioned disadvantages of the heretofore-known devices and methods of this general type and which provides for a supporting system for a heating element in a heater and also a heating system with such supporting systems, wherein thermally induced stress inside the heating element is reduced during operation and the heating element and the heating system are especially suitable for high-temperature applications.

With the foregoing and other objects in view there is provided, in accordance with the invention, a supporting system for supporting a heating element, the supporting system comprising:

a supporting member having a main extension direction extending substantially in a height direction, a proximal end configured to support the heating element, and a distal end;

a resilient system including a spring element coupled to the distal portion of the supporting member distally from the proximal end, the resilient system being configured to provide resiliency of the supporting member in a resilient direction and to substantially restrict a movement of the supporting member in a rigid direction;

the resilient system extending at least partly from the distal portion in the height direction towards the proximal end.

In other words, according to the invention, the supporting system for the support of a heating element comprises a supporting member which is adapted to support the heating element. The supporting member is preferable rigid and of elongated shape, it has a main extension direction and extends substantially in a height direction. Preferably, the main extension direction is exactly parallel or angled ≤10° with regard to the height direction, however, the supporting member does not need to have a strictly straight configuration.

The height direction can be defined to be perpendicular to the extension plane of the heating element in the local region where it is mounted at the supporting member in the oriented position. Preferable the heating element has a curved main extension direction and is arranged in a planar configuration which defines the extension plane. In case that the arriving part of the heating element at the supporting member is of substantially straight configuration the height direction can be defined by the overall geometric structure of the heating element.

According to the present invention, the supporting member has two ends, a proximal end and a distal end. The proximal end is facing towards the heating element and has a supporting portion for the support of the heating element. The distal end is arranged distal from the proximal end and has a distal portion to which a resilient system comprising a spring element is coupled. The distal portion is arranged distal from the proximal end. Preferable the spring element is coupled to the distal end. The coupling can be either directly or mediated via a further connecting member arranged between the distal portion and the resilient system. Furthermore, the resilient system comprises a main elastic direction which is oriented substantially along a resilient direction, wherein the resilient direction is defined by a direction which is substantially perpendicular to the height direction (the angle is preferably in the range of 75-105°, it may also be exactly 90°). In addition, the resilient system comprises a substantially rigid direction which is perpendicular to the resilient direction and perpendicular to the height direction.

The main elastic direction can be understood as the direction in which the material and/or the geometry of the resilient system have their main resiliency. Thus, the resilient system provides the heating element the possibility to move along the resilient direction during thermal extension while it substantially hinders the heating element to displace in the substantially rigid direction. According to the invention, the resilient system, in particular the spring element extends at least partially from the distal portion in the height direction towards the proximal end. Furthermore, the spring element of the resilient system can be secured to a base e.g. to a base plate in the heating system or the heater housing comprising the heating element.

During the heating up process of the heating element the heating element tries to expand its dimensions and thermal induced stress causing irregular deformations would build up if a relative movement between the heating element and basis portion where the spring element is fastened to a base of the heating system is prohibited. With this inventive arrangement it can be achieved that the thermally induced displacement of the heating element is substantially reduced to only one single direction, in particular the resilient direction or the height direction, respectively. This leads to the possibility that thermally induced mechanical stress inside the material of the heating element and thus the risk of plastic deformations is decreased. In particular bending moments caused by tilting of the heating element can be reduced. Consequently, less expensive material can be used for the heating element and the life time of the heating element will be increased.

As a further advantage of the invention, a heating system can be realized which on the one hand has a very compact construction with a comparably small height and on the other hand still can be operated at high temperatures, in particular at temperatures above 1600° C. Due to the extended elongated shape of the supporting member a resulting significant temperature difference between the proximal and distal end of the supporting member can be achieved, especially when the supporting member is arranged in proximity to the bottom surface of the heating system, which typically is cooled by a liquid such as water. Furthermore, in a preferred embodiment the resilient system is protected from heat via a heat shield system which can be arranged between the heating elements and the resilient system. Thus, the resilient elements are at a considerably lower temperature at which the material is less stressed and the material properties, in particular the elastic properties are retained. The inverted arrangement of the resilient system, which extends at least partially in the height direction towards the proximal end of the supporting member, enables an extremely compact construction of the supporting system so that compared to known conventional designs considerable less height is required between the heating element and the bottom surface of the heating system.

In a preferred embodiment, the main extension direction of the supporting member is substantially parallel to the height direction. Thus, it is substantially perpendicular to the plane spaced by the heating element configuration.

The inventive supporting system can provide mechanical support of the heating element only or can be configured both for mechanical support and electric supply of the heating element with electrical power. For the realization of an electric contact the inventive arrangement has the further advantage that since the flexible parts have lower temperatures and the electrical resistance of typically used conducting material drops significantly with decreasing temperature, the electric resistance is reduced in the parts with flexible elements and less heat is dissipated there. Thus the amount of heat generated by the flow of electric current in the resilient system is minimized.

In an advantageous embodiment the arrangement of the supporting member and the resilient system with the spring element as well as an optional connecting member extend in a tangential direction which is orthogonal to the resilient direction and orthogonal to the height direction. Furthermore, in a preferred embodiment, the resiliency along the resilient direction is provided by a leaf spring whereas the leaf spring can comprise two or more leafs which are arranged substantially parallel in orientation. Preferably, the two or more leafs are oriented parallel to the tangential direction, so that the main elastic direction of the spring element lies in the resilient direction. The leaf spring is coupled to the distal portion of the supporting member, in particular via a rigid connecting member, and arranged substantially parallel to the height direction towards the proximal end of the supporting member. The construction of the leaf spring leads to a mechanical stiffness matrix which enables deflections in substantially the resilient direction while it decouples and hinders deflections in the orthogonal rigid direction in a reliable and controlled way. This prevents tilting deformations of the heating element during heating. Preferable, the leaf springs are substantially of plate like geometry. The dimensions of the leaf springs are in a wide direction in particular between 10 to 75 mm, in height in particular between a 100 to 150 mm and in thickness in particular between 0.1 to 1 mm. The use of at least two leaf springs enables movement of the proximal end in a plane parallel to the extension plane of the heating element thus avoiding the tilting of the heating element out of plane. At the same time it provides for inexpensive and simple construction of the resilient system.

The invention further includes a supporting system for the support of a heating element which comprises a preferable rigid supporting member having a main extension direction extending substantially in the height direction. The supporting member further has a proximal end with a supporting portion for support of the heating element and a distal end which is arranged distal from the proximal end and which is directly or indirectly via a further member engaged in a rigid rail guide. The rail guide can be secured to a base, e.g. the bottom surface of the housing of the heating system, and is oriented in a resilient direction in a plane substantially perpendicular to the height direction. A spring element is coupled to a distal portion of the supporting member which is arranged distal from the proximal end and provides an elastic force on the supporting member in the resilient direction. In the heating process the expansion of the heating element is guided by the rigid rail arrangement. Thus, during thermal expansion tilting of the heating element as well as a deformation of the heating element in the height direction can be substantially avoided. It can be advantageous if the spring extends at least partially in the height direction towards the proximal end of the supporting member.

In this embodiment the resilient system is realized by an arrangement of a rail guide with a spring element which does not necessarily require a complex spring element which has a pronounced main elastic direction or a spring element whose main elastic direction is aligned with the resilient direction. In an advantageous embodiment the spring element is formed by a U-shaped spring. The U-shaped spring is arranged such that an elastic force can be provided in the resilient direction along the rail guide, but the main elastic direction of the U-shaped spring does not necessarily need to be oriented in the resilient direction. Preferable, the main elastic direction of the spring is substantially aligned in the resilient direction. In an advantageous embodiment the U shaped spring is oriented in a tangential direction which is orthogonal to the resilient direction and orthogonal to the height direction. In another advantageous embodiment the U-shaped spring is oriented in the height direction.

Furthermore, regarding material composition parts of the inventive supporting system, in particular the supporting member and/or the spring element, can comprise at least 90% by weight of a refractory metal. In particular, the refractory metal is selected from tungsten, molybdenum, niobium, tantalum, rhenium, and alloys thereof. One example for the material is tungsten or an alloy of tungsten (at least 90% by weight of tungsten), for example vacuum metalized tungsten alloy which besides tungsten comprises a small amount of potassium silicate. A further example for the material is molybdenum or an alloy of molybdenum (at least 95% by weight molybdenum).

A supporting system which provides mechanical support only needs to be electrically isolated against the base where it is fixed respectively against the housing of the heating system. In particular, electrical isolation can be provided by alumina ($Al_2O_3$) or boron nitride (BN) or ceramic materials such as aluminum nitride (AlN) or silicon alumina nitride (SiAlON), etc.

Those skilled in the art will appreciate that there are numerous methods how to connect the heating element to the supporting member. These methods include twisted wire, clamping, welding, screwing, bolting and the like. For a supporting system which in addition provides electrical contact, the method selected should ensure sufficient surface contact between the supporting member and the heating element in order to achieve proper electrical connection between the supporting member and the heating element.

With the above and other objects in view there is also provided, in accordance with the invention, a heating system comprising at least one heating element and at least two supporting systems as described herein. The heating system in particular can be configured such that it can be used as a heater in a MOCVD reactor.

The inventive heating system can be characterized such that each heating element comprises two supporting systems which are configured for power supply to the heating element and which are located at both ends of the heating element. The power supply supporting systems are in particular also configured for mechanical support of the heating element. In addition, further supporting systems are possible, in particular only for mechanical support of the heating element which are located with respect to the two ends of the heating element between the two supporting systems for power supply.

According to the invention the respective resilient directions of the different supporting systems of a single heating element originate from a common central point whereas the central point in particular can be chosen to lie in the extension plane of the heating element. In other words, in order to adjust the different supporting systems of a single heating element a common central point preferable in the extension plane of the heating element is defined. From this central point each of the supporting systems is aligned such that its respective resilient direction is oriented from the central point radially outwards.

It is advantageous that as in most known common heating systems the heating element or an arrangement of a plurality of heating elements are arranged in a planar configuration. In particular for MOCVD reactors various examples thereof are described in U.S. Pat. No. 7,645,342 B2, which document is incorporated herein by reference. In an advantageous embodiment the heating element has a substantially circular configuration which is interrupted at some point leading to a first and a second end of the heating element defining a small interruption between. At the first and second end the heating element is electrically connected to a power source. It is advantageous if the central point is in coincidence with or close to the center of the (interrupted) circular configuration of the heating element. Thus, the resilient directions of the supporting systems are oriented radially outwards from the center of the (substantially) circular heating element.

Furthermore, the inventive heating system can be characterized in that the spring element of at least one supporting system is pre-tensioned in its rest (stable) position at room temperature. It is advantageous if the direction of the pre-tension is in direction of the direction of movement of the supporting member during usage of the heating element. Thus, the direction of the pre-tension corresponds in particular with the resilient direction of the supporting system. If the present invention is used for a heating system with a substantially circular extension, it is advantageous to provide a pre-tension in the outward, namely in a from the central point radial direction.

The heating element keeps the supporting system in place and thereby counterbalances the pre-tension in the rest position. Preferable, the pre-tension force exerted by the spring element on the heating element at room temperature does not exceed the limiting creep stress of the heating element material.

Furthermore, an inventive heating system is in particular characterized in that the pre-tension of the spring element is configured to provide a reduced spring tension onto the heating element at operational temperature. In particular, it is configured such that the stress is reduced to a value which is lower than the limiting creep stress of the heating element at the operational temperature. Preferably, the load exerted by the spring element onto the heating element vanishes at operational temperature. The general underlying idea is that while the heating element heats up and its material properties deteriorate, the force exerted by the spring elements onto the heating element decreases and always stays below the creep limit of the heating element. When the heating element cools down again and consequently its creep stress increases, the load exerted by the spring element increases again. This way plastic deformations can be avoided.

In an advantageous embodiment the heating system includes a heat shield system comprising one or a plurality of heat shields which are arranged below the heating elements. In a preferable embodiment the supporting member extends through openings in the heat shield system. The spring elements in contrary are arranged below the heat shield arrangement and therefore will be protected from radiant heat Other features which are considered as characteristic for the invention are set forth in the appended claims. It will be understood that the embodiments of the invention presented above can be combined freely with each other. Many of the embodiments can be combined in order to form a new embodiment.

Although the invention is illustrated and described herein as embodied in an supporting system for a heating element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1A:
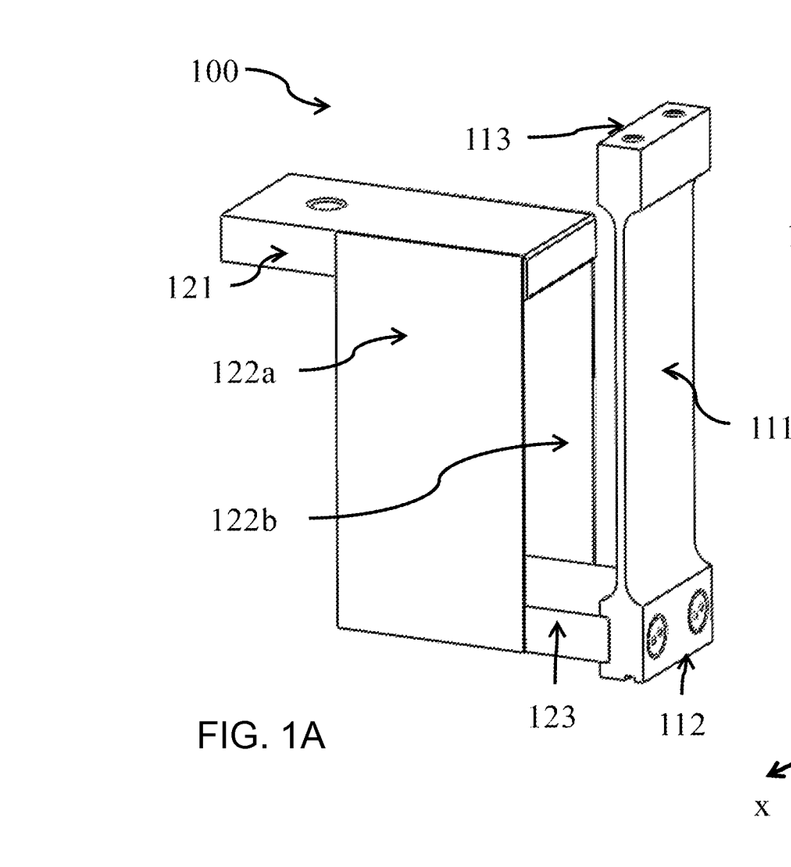
FIG. 1A is a perspective view of a supporting system according to the present invention.
Figure 1B:
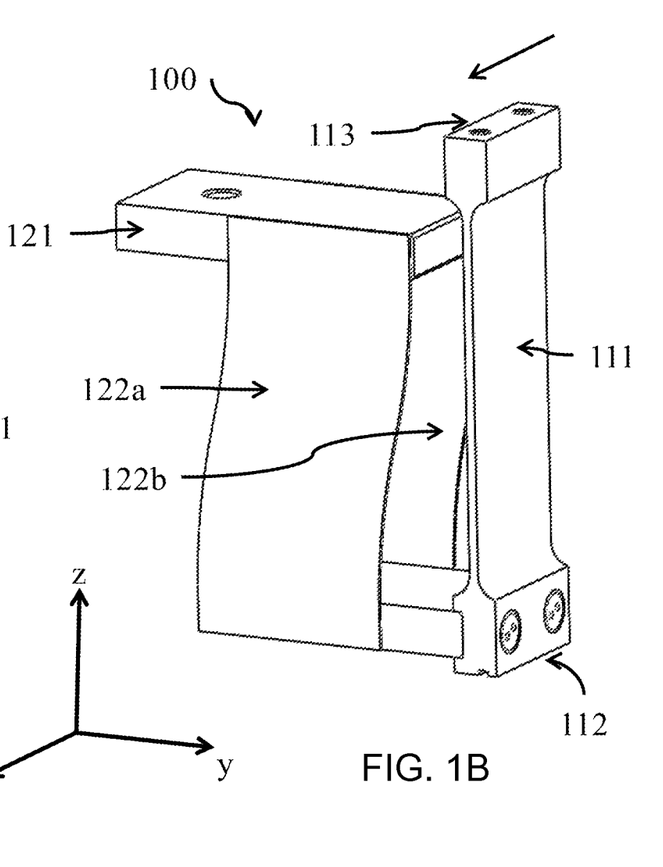
FIG. 1B is a perspective view of the supporting system of FIG. 1A during the operational situation at high temperature.

Referring now to the figures of the drawing in detail and first, particularly, to FIGS. 1A and 1B thereof, there is shown a supporting system (100) according to an exemplary embodiment that comprises an elongated rigid supporting member (111) with a distal end (112) and a proximal end (113). On top of the rigid supporting member (111) a heating element is mounted (see FIGS. 4, 5) which extension defines an extension plane. The main extension of the supporting member (111) extends in a height direction z which is perpendicular to the extension plane of the heating element. The supporting system further comprises a base member (121) which is e.g. fixed on a support plate (not shown) with screws or any other kind of mechanical fixation. Between the supporting members (111) and the base member (121) a spring element (122) is located which in this embodiment is realized with at least two leaf springs (122a, 122b). The spring element (122) is fixed with screws, rivets, welding or other methods to the distal portion of the supporting member (111) via a rigid connecting member (123) and extends in its entirety in the height direction substantially parallel towards the proximal end (113) of the supporting member. Due to this inverted arrangement of the spring element a very compact construction of the heating system is achieved. The leaf springs (122a, 122b) are arranged in a substantially parallel orientation and can deform according to a parallelogram in the resilient direction x which is the main elastic direction of the spring element (122). The resilient system (120) comprising the base member (121), leaf springs (122) and the connecting member (123) extends substantially in a rigid direction y orthogonal to the height direction z and resilient direction x.

Figure 5:
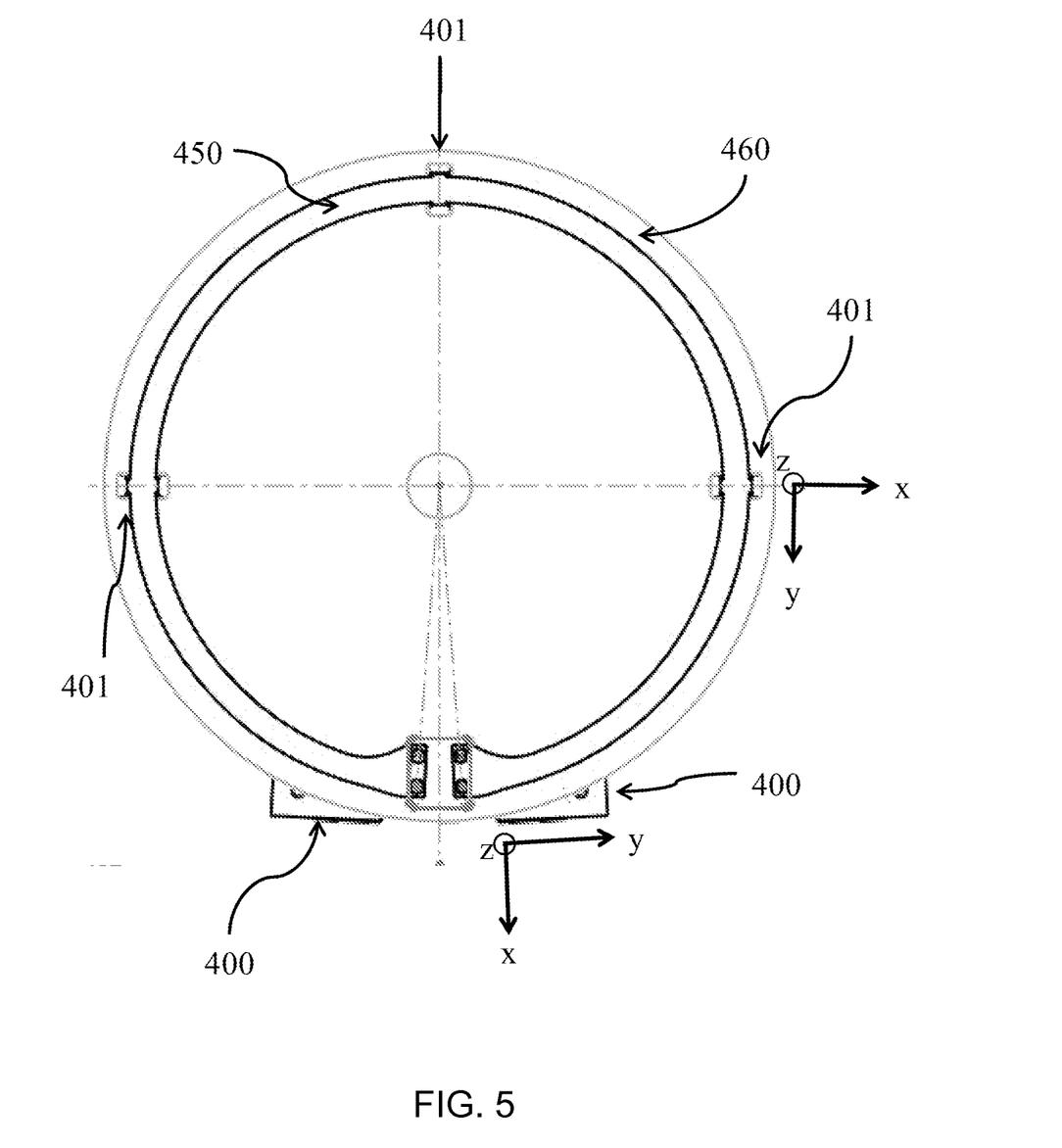
FIG. 5 is a top view of the heating system of FIG. 4.

FIG. 1B illustrates a situation at elevated temperatures when the thermal expansion of the heating element causes a deflection of the supporting system. During the heating process the dimension of the heating element increases and when arranged in a circular configuration a top view of this situation is shown in FIG. 5—the heating element tends to move radially outward. In order to reduce thermally induced stress inside the heating element, the supporting system (100) according to the present invention allows a movement of the heating element relative to the base member (121). The supporting member (111) is dislocated as to the base member (121) by a movement in the resilient direction x. The different leaf springs (122a, 122b) are bent and since they are arranged substantially parallel, they comprise a single main elastic direction which is directed in the resilient direction x. Therefore, the deformation in the resilient direction is decoupled from further deformation directions of the heating element as well as of the supporting member.

The above corresponds to a situation when the spring element has no pre-tension at room temperature. In an embodiment where the spring element is pre-loaded at room temperature, the situation is reversed: The leaf springs are deformed at room temperature (FIG. 1B), which provides the preloading force. As the heating element expands, the supporting member (111) moves in the resilient direction x, so that the leaf springs become straight (compare FIG. 1A) and the force in the resilient direction x eventually goes to zero at maximum operating temperature.

While the supporting member (111) in this specific embodiment is realized as an extended linear object, in general the supporting member (111) does not have to be of straight configuration nor has to be arranged parallel to the height direction z. However, it has to be ensured that the heating element can move freely in a resilient direction x.

Figure 2:
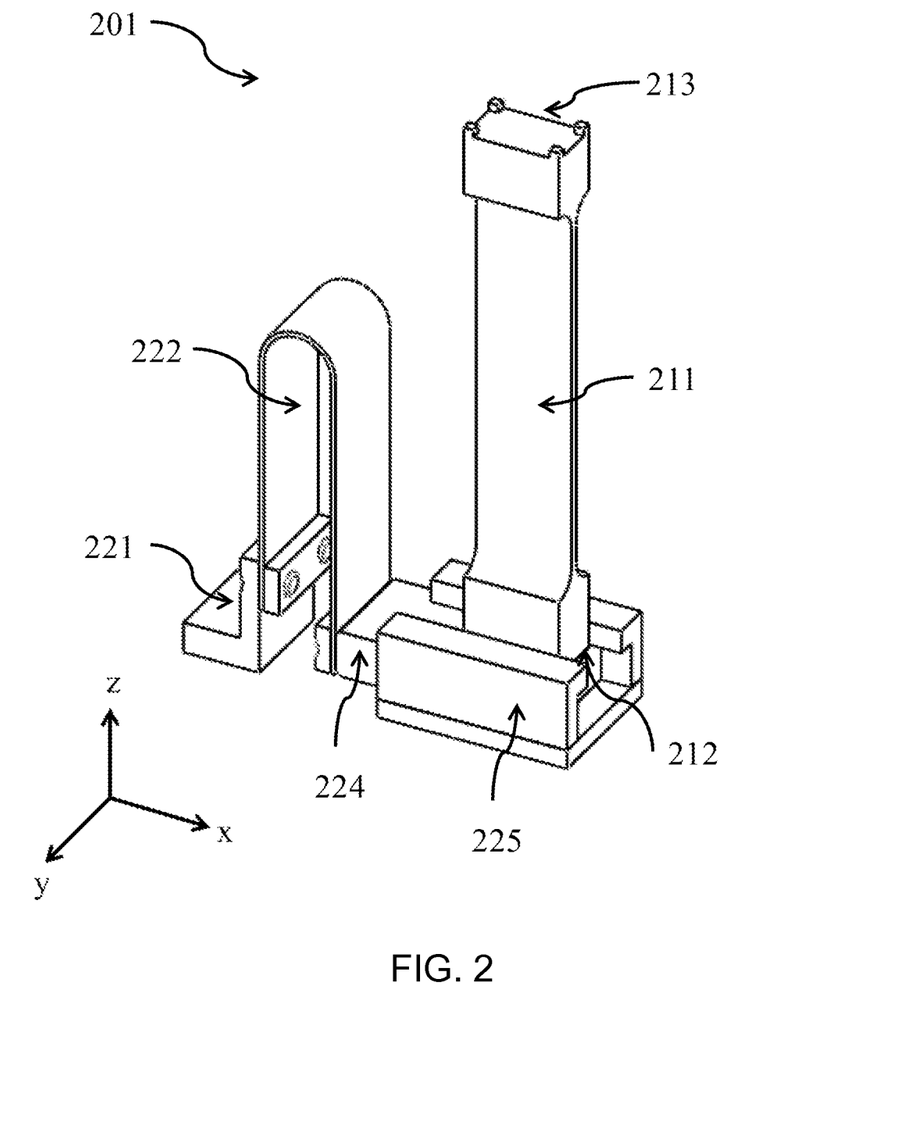
FIG. 2 is a perspective view of another embodiment of the supporting system according to the invention.
Figure 3:
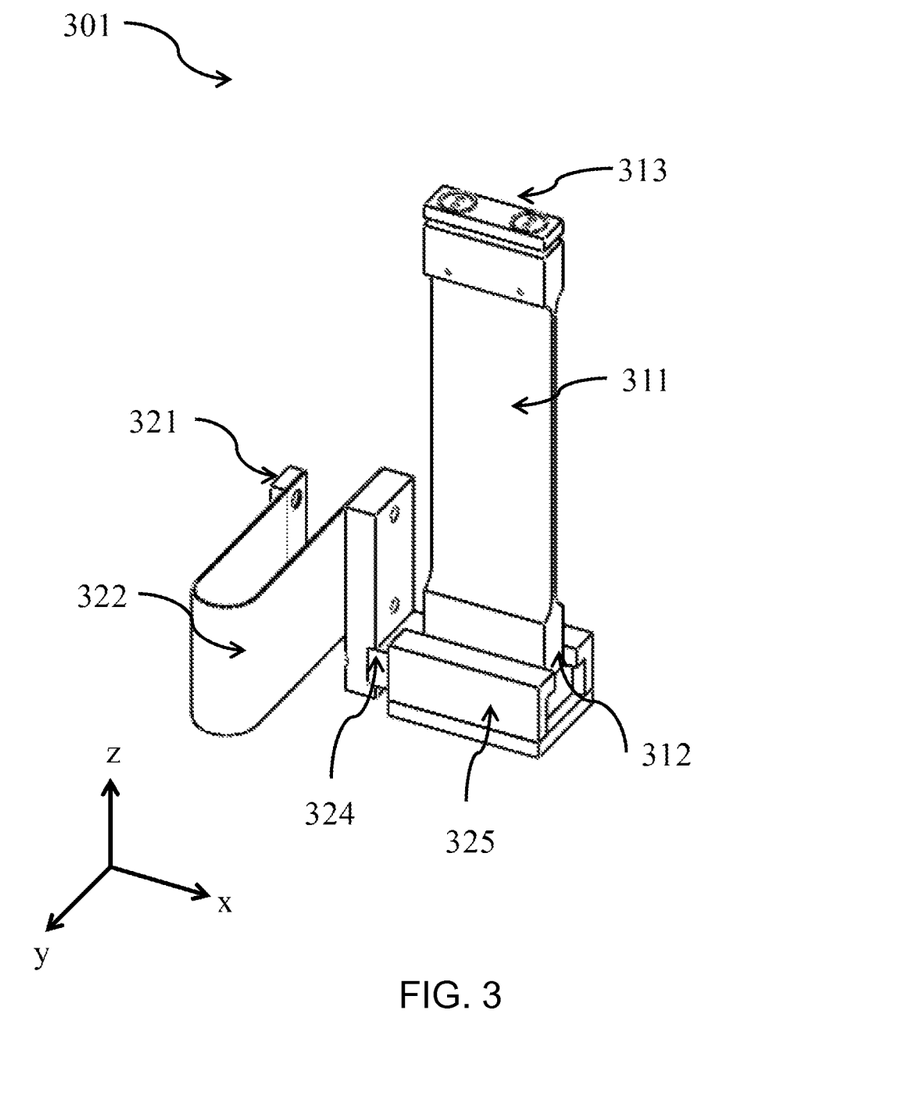
FIG. 3 is a perspective view of yet another embodiment of the supporting system according to the invention.

FIG. 2 depicts a different embodiment of the supporting system (201) according to the present invention. The distal end of the elongated supporting member (211) is fixed to a sliding element (224) which is engaged in a rigid rail guide (225). The sliding element is coupled to a spring element (222) which is fastened via the base (221) to a support plate of the heating system (not shown). The rail guide (225) can be secured to a base, e.g. the bottom surface of the housing of the heating system (not shown). Due to the rail guide the movement of the supporting member (211) is limited to the resilient direction x. Therefore, during the heating process tilting of the heating element as well as a deflection of the heating element in the height direction z is avoided. The rail guide is made of electrically isolating material, in particular known ceramic materials like $Al_2O_3$, BN, AlN or SiAlN. In order to prevent decomposition or evaporation of ceramics the supporting system has to be configured such that the temperature at the interface between the supporting member (211) and the rail guide (225) does not exceed temperatures around 1500-1600° C. Nevertheless, due to the elongated shape of the supporting member (211) in operation a temperature gradient will build up between the distal and the proximal end of the supporting member (211) and therefore the heating element can be operated at considerably higher temperatures. In this embodiment the spring element (222) which provides a force on the supporting member in the resilient direction x is arranged in the resilient direction and extends in the height direction z towards the proximal end of the supporting member. There are other different orientations of the spring element possible. In FIG. 3 an arrangement for the spring element (322) is shown which extends substantially in the rigid direction y. The spring element does not require a complex construction with a pronounced main elastic direction which is directed along a single direction, it is only necessary that one component of the spring element provides an elastic force in the resilient direction x.

Figure 4:
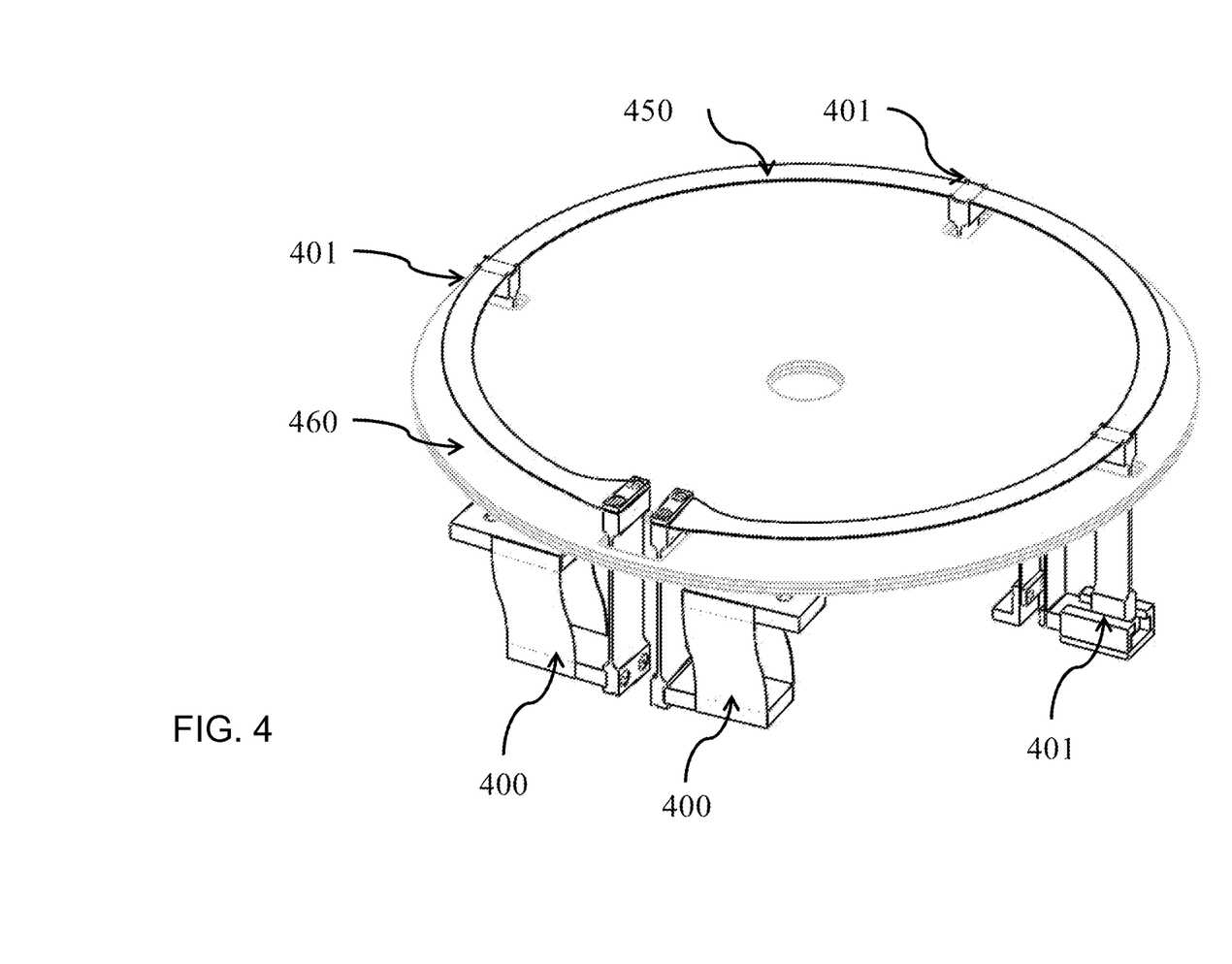
FIG. 4 is a perspective view of a heating system.

FIG. 4 illustrates an exemplary heating system according to the present invention comprising a heating element (450) with an interrupted circular configuration mounted on two supporting systems (400) at its end respectively. These supporting systems (400) at the heating element ends are configured for the supply of the heating element with electric power. Additional supporting systems (401) are provided for mechanical support of the heating element which are electrically isolated against the base at which they are mounted. In the shown embodiment the electrical contacts are provided by a resilient system comprising leaf springs (400) while the movement of the supporting systems for mechanical support (401) is guided by rail guides. It should be readily understood that the invention is not limited to this specific embodiment, certainly different embodiments of the supporting system can be employed and other combinations of support systems are possible. In particular the electricity supplying supporting systems (400) can be realized by a rail guide system according the embodiment in FIG. 3 whereas the spring elements extend in the rigid direction y and are arranged mirror like in opposing directions. In the present embodiment the conducting supporting systems (400) are characterized by a pre-tension in the resilient direction at room temperature and are configured to provide a reduced spring tension onto the heating element at operational temperature.

It is advantageous if the flexible parts of the supporting system are protected by a heat shield system (460) comprising one or stacked layers of heat shields. The heat shields are placed in close proximity to one another with a 1-5 mm separation being typical. They are maintained by spacer elements in the desired position. The supporting members of the supporting system (400, 401) extend through openings in the heat shields.

FIG. 5 shows a top view of the heating system in FIG. 4 and illustrates the orientation of the resilient direction of the supporting systems (400,401). In this embodiment the respective resilient directions of the different supporting systems (400,401) originate from the center of the substantially circular heating element and are oriented in the extension plane of the heating element radially outwards.

The invention claimed is:

1. A supporting system for supporting a heating element, the supporting system comprising:
    a supporting member having a main extension direction extending substantially in a height direction, a proximal end configured to support the heating element, and a distal end;
    a resilient system including a spring element coupled to said distal portion of said supporting member distally from said proximal end, said resilient system being configured to provide resiliency of said supporting member in a resilient direction and to substantially restrict a movement of said supporting member in a rigid direction;
    said resilient system extending at least partly from said distal portion in the height direction towards said proximal end;
    wherein an assembly formed by said supporting member and said spring element substantially extends in the resilient direction or in the rigid direction.

2. The supporting system according to claim 1, wherein said spring element has a main elastic direction substantially along the resilient direction.

3. The supporting system according to claim 1, wherein said spring element comprises two or more leaves arranged in a substantially parallel orientation.

4. The supporting system according to claim 1, wherein said resilient system further comprises a rail guide arrangement oriented in the resilient direction and having said the distal end of said supporting member directly or indirectly engaged therewith via a further member.

5. The supporting system according to claim 4, wherein said spring element is a U-shaped spring.

6. The supporting system according to claim 1, wherein a material of one or both of said supporting member and said spring element comprises at least 90% by weight of a refractory metal.

7. The supporting system according to claim 6, wherein said refractory metal is selected from the group consisting of tungsten, molybdenum, tantalum, rhenium, niobium and alloys thereof.

8. A heating system, comprising at least two supporting systems each according to claim 1, and at least one heating element supported on said at least two supporting systems.

9. The heating system according to claim 8, wherein said supporting systems are oriented such that the respective resilient directions of the at least two supporting systems originate from a common central point.

10. The heating system according to claim 8, wherein the spring element of at least one of said at last two supporting systems is pre-tensioned in a stable position thereof.

11. The heating system according to claim 8, which further comprises a heat shield system arranged below said heating element and above said spring elements, said heat shield system having openings formed therein enabling said supporting members to extend therethrough.

12. A supporting system for supporting a heating element, the supporting system comprising:
    a supporting member having a main extension direction extending substantially in a height direction, a proximal end configured to support the heating element, and a distal end;
    a resilient system including a spring element coupled to said distal portion of said supporting member distally from said proximal end, said resilient system being configured to provide resiliency of said supporting member in a resilient direction and to substantially restrict a movement of said supporting member in a rigid direction;

said resilient system further including a rail guide arrangement oriented in the resilient direction and having said distal end of said supporting member directly engaged therewith or indirectly engaged therewith via a further member;

said resilient system extending at least partly from said distal portion in the height direction towards said proximal end.

13. The supporting system according to claim 12, wherein said spring element is a U-shaped spring.

* * * * *